United States Patent [19]

Weigand

[11] Patent Number: 4,582,191

[45] Date of Patent: Apr. 15, 1986

[54] ARTICLE HANDLING APPARATUS AND METHOD

[76] Inventor: Robert E. Weigand, 6456 Bancroft Way, San Jose, Calif. 95129

[21] Appl. No.: 707,104

[22] Filed: Feb. 28, 1985

Related U.S. Application Data

[63] Continuation of Ser. No. 389,189, Jun. 17, 1982, abandoned.

[51] Int. Cl.⁴ .............................................. B65G 65/02
[52] U.S. Cl. ................... 198/339.1; 414/225; 414/744 B; 198/471.1; 350/532
[58] Field of Search ........... 414/744 R, 744 A, 744 B, 414/744 C, 222–225; 198/480, 803, 684; 350/532

[56] References Cited

U.S. PATENT DOCUMENTS

| | | | |
|---|---|---|---|
| 2,265,182 | 12/1941 | Mestre | 350/532 |
| 2,789,680 | 4/1957 | Kerr | 414/744 b x |
| 3,161,753 | 12/1964 | Schmick | 414/744 R X |
| 3,344,900 | 10/1967 | Drop | 198/394 X |
| 3,441,121 | 4/1969 | Pastuznak | 198/394 X |
| 3,874,525 | 4/1975 | Hassan et al. | 414/225 |
| 4,200,182 | 4/1980 | Siarto | 414/744 A X |
| 4,501,527 | 2/1985 | Jacoby et al. | 414/744 B X |

FOREIGN PATENT DOCUMENTS 1274267  5/1972  United Kingdom .............. 198/480

*Primary Examiner*—Terrance L. Siemens
*Attorney, Agent, or Firm*—Townsend and Townsend

[57] ABSTRACT

Apparatus and method for handling articles, such as semiconductor wafers, wherein an article is movable by the apparatus from one location along a continuous path to any one of a number of other locations in a sequence so that process steps for other functions can be performed at each station. The apparatus is suitable for use with a microscope having a work station at which articles can be inspected one after another. The apparatus includes a pair of concentric rings, the inner ring being rigidly secured to a microscope and surrounding the upright center post of the microscope. The outer ring is rotatable on the inner ring and has a number of circumferentially spaced article pick-up devices which operate to receive articles and carry them one by one to the work station where a vacuum chuck can become coupled to each article and an X-Y positioning unit can be used to shift the article beneath an optical system for viewing the article. Several embodiments of the pick-up devices on the outer ring are disclosed. The pick-up device can be a vacuum operated or mechanical in construction and at least one embodiment of each type of device is disclosed.

16 Claims, 9 Drawing Figures

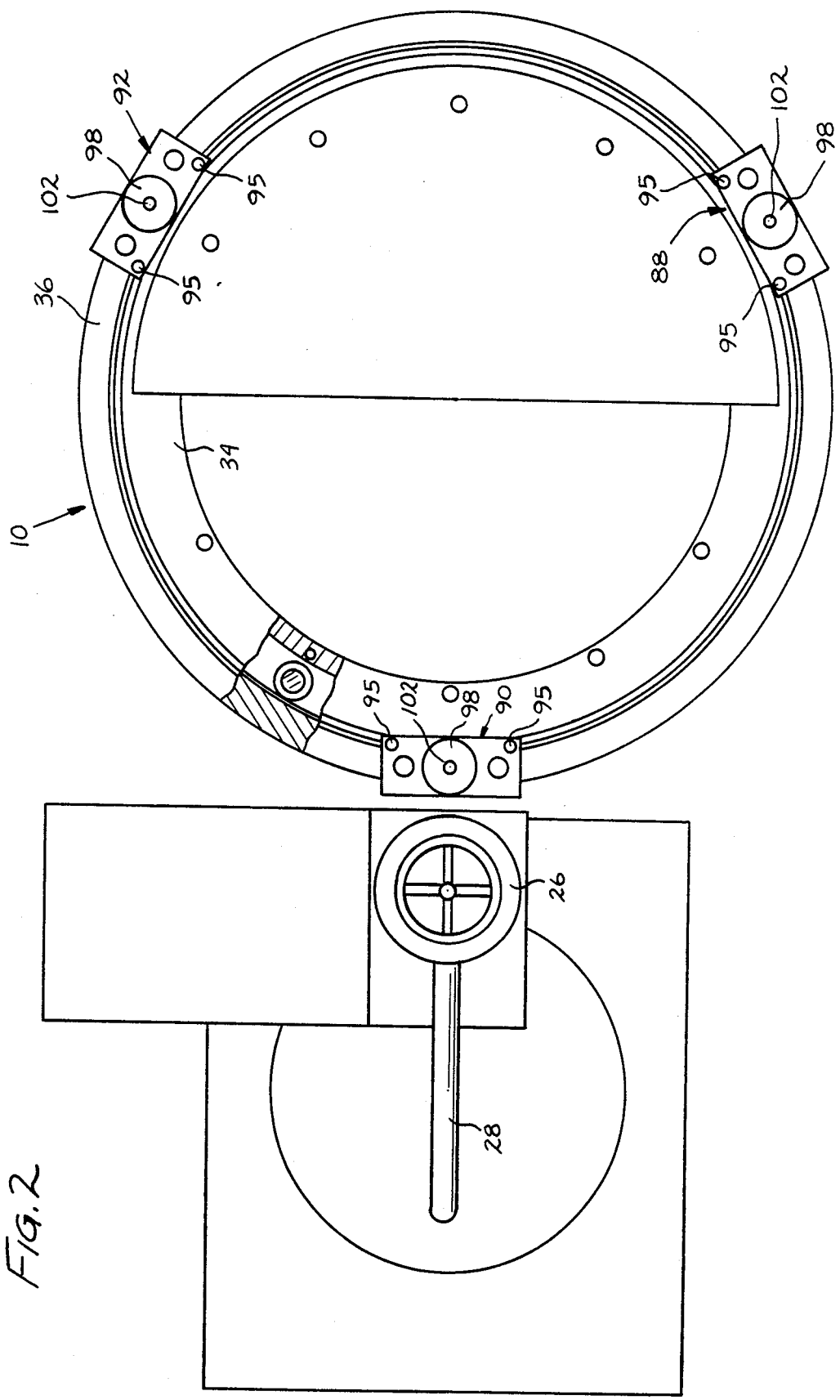

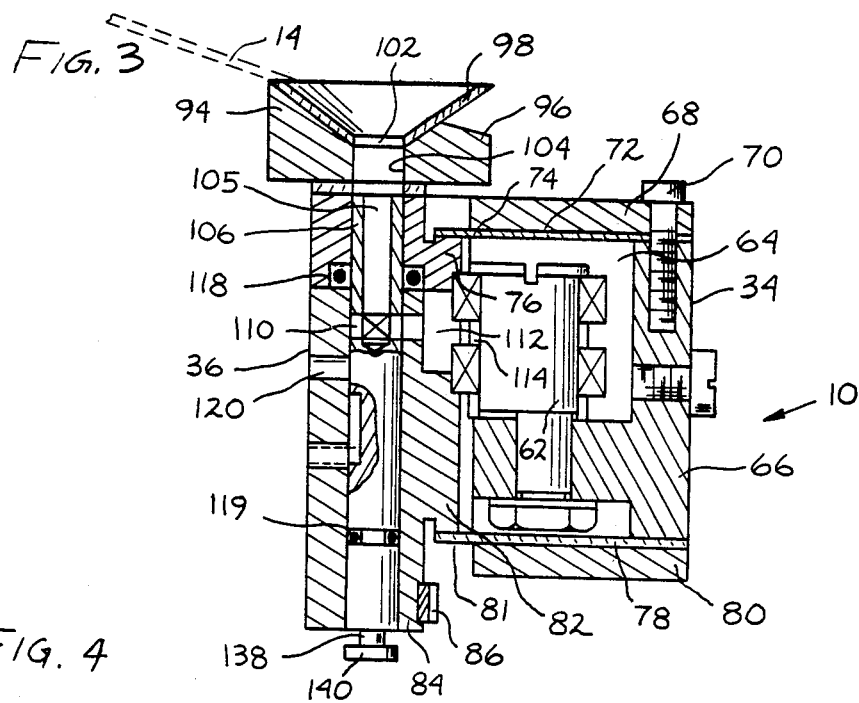
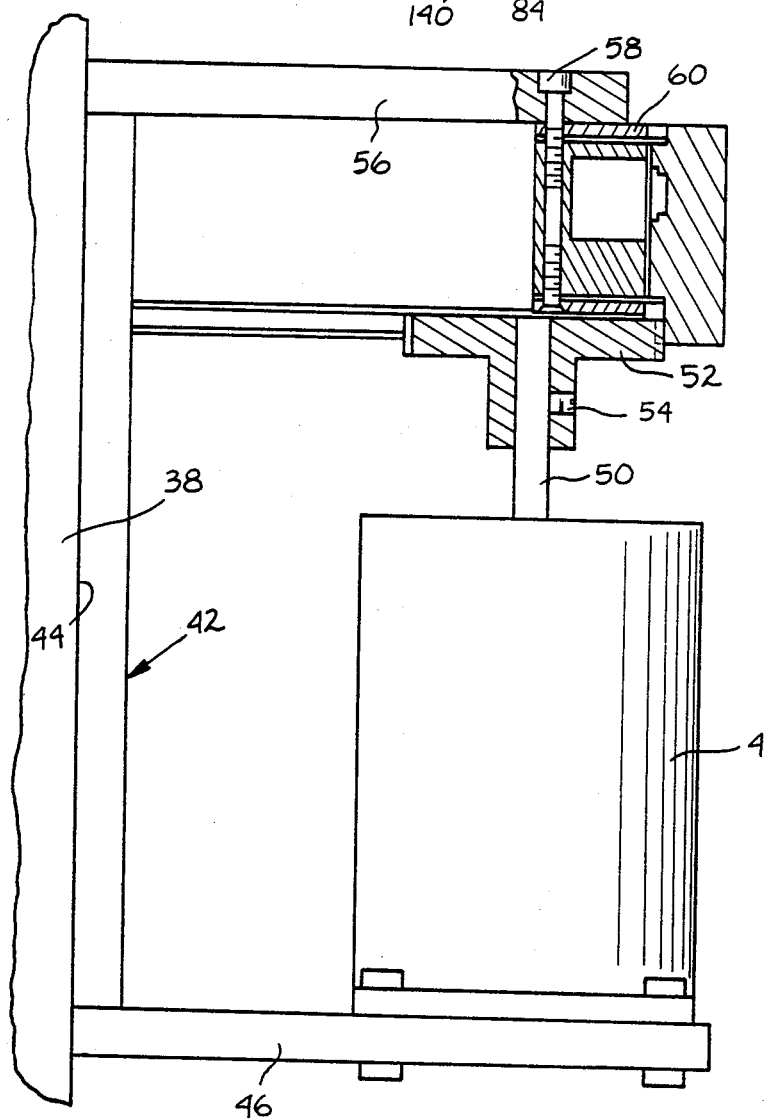
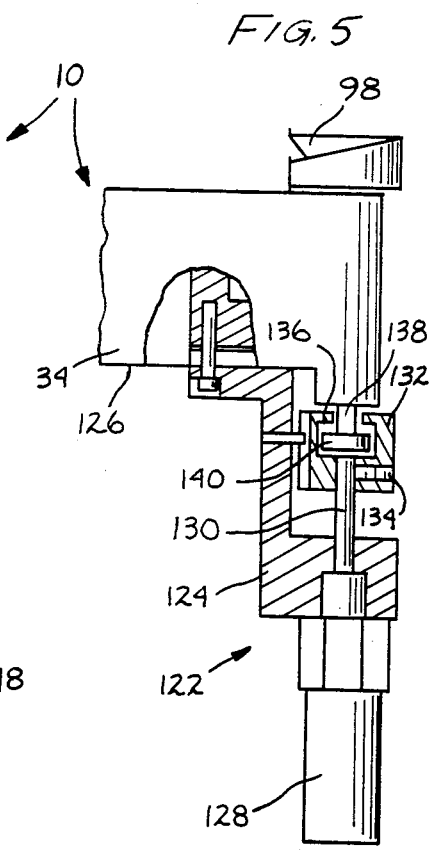

ARTICLE HANDLING APPARATUS AND METHOD

This is a continuation of application Ser. No. 389,189, filed June 17, 1982, now abandoned.

This invention relates to improvements in processing techniques relating to semiconductor wafers and other similar articles of commerce and, more particularly, to apparatus and a method for transporting such wafers or articles to and from work stations.

BACKGROUND OF THE INVENTION

Automated structures for receiving and transporting articles of different types have been known and used in the past. A number of disclosures have been made which relate to the handling of semiconductor wafers. Two of such disclosures are U.S. Pat. Nos. 3,441,121 and 3,865,254. Other articles, such as capsules and flexible container closure members, have been handled by structures disclosed in U.S. Pat. Nos. 3,811,552 and 4,155,439.

Generally, article-handling structures of conventional design are complex in construction and, as a result, are expensive to produce and to maintain. Also, none of the conventional structures have been made for use as an accessory to a conventional microscope of the type used for inspection and other purposes. Thus, the need has arisen for apparatus and a method for handling semiconductor wafers and other similar articles of commerce in a manner to avoid the problems mentioned above with respect to the structures of the prior disclosures.

SUMMARY OF THE INVENTION

The present invention satisfies the aforesaid need by providing an apparatus and a method for handling semiconductor wafers and other similar articles of commerce in which the apparatus is especially adapted for use as an accessory for a microscope of conventional construction. To this end, the apparatus includes a movable member which, in a preferred embodiment of the invention, comprises an outer ring rotatable on an inner ring with the rings being concentric with each other. The outer ring has a member of spaced wafer or article pick-up devices of improved construction on its outer periphery at spaced locations thereon so that wafers or other similar articles can be releasably coupled to the outer ring and moved from place to place, such as to inspection stations along the outer periphery of the ring.

The invention is simple and ruggid in construction and can be operated with substantially no skills on the part of the operator. The system is designed to be compact to minimize space requirements and to make it readily adaptable for attachment to conventional microscopes, yet the system is highly efficient to operate and can be used without damage to the articles which are handled by the system.

The primary object of the present invention is to provide an apparatus and a method of the type described wherein semiconductor wafers or similar articles can be safely picked-up and transported to a series of work stations, yet the apparatus is simple and rugged in construction, is inexpensive to produce and maintain, and the practice of the method avoids the drawbacks and problems associated with the handling of such articles with conventional structures.

Another object of the present invention is to provide a wafer handling apparatus and a method suitable for use as an accessory for a conventional microscope wherein the apparatus is mounted in surrounding relationship to the upright post of the microscope and at a location to avoid interference with the normal use of the microscope, yet a large number of semiconductor wafers can be moved quickly, easily and safely to and from the work station of the microscope so that automated functions, such as inspections of the wafers, can proceed on a continuous basis to simplify such functions and to reduce labor and equipment costs.

Other objects of this invention will become apparent as the following specification progresses, reference being had to the accompanying drawings for an illustration of the invention.

IN THE DRAWINGS

FIG. 2 is a top plan view of the wafer handling system adjacent to a wafer inspection station of the microscope, the microscope being deleted to simplify the drawing;

FIG. 3 is an enlarged, vertical cross section of a portion of the apparatus of the present invention, showing the suction cup pick-up device and the means for coupling a source of suction to the suction cup;

FIG. 4 is an enlarged, fragmentary side elevational view of the mount for coupling the apparatus to the microscope, and the stepping motor on the mount and coupled with one of the rings of the apparatus for advancing the pick-up device to and from the work station of the microscope;

FIG. 5 is a fragmentary, side elevational view, partly in section, of a portion of the apparatus showing the way in which each pick-up device is shifted to break the suction force applied thereto;

Figure 1:
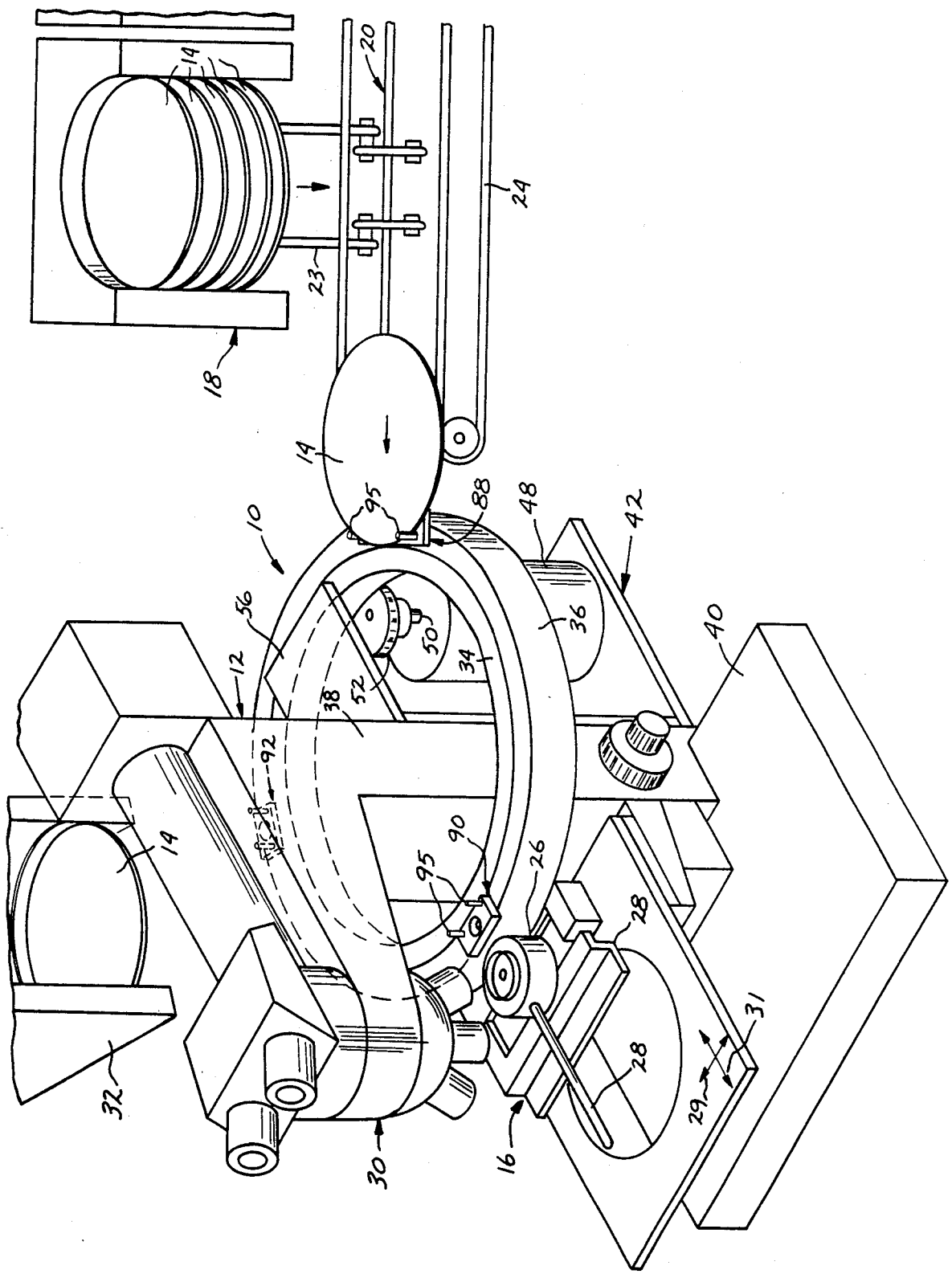
FIG. 1 is a perspective view of a microscope having the wafer handling system of the present invention mounted thereon and showing a semiconductor wafer being coupled to the apparatus after the wafer has been removed from a wafer magazine by a conveyor.

The article handling apparatus of the present invention is broadly denoted by the numeral 10 and is shown in FIG. 1. Apparatus 10 can be used to pick-up and transport articles of various types but, for purposes of illustration, apparatus 10 will be described as handling semiconductor wafers of circular configuration.

Apparatus 10 is mounted on a conventional microscope 12 for delivering semiconductor wafers 14 one by one to an inspection or work station 16 of the microscope. The wafers are initially housed in a wafer magazine 18 of conventional construction. A conveyor 20 associated with magazine 18 permits wafers 14 to be fed one by one through an opening 22 in one side of magazine 18 so that a wafer 14 can be moved laterally from magazine 18 by a first conveyor unit 23 and then longitudinally by a second conveyor unit 24 toward apparatus 10.

As soon as apparatus 10 receives a wafer 14 as shown in FIG. 1, the apparatus is rotated to shift the wafer to work station 16 and on to a vacuum chuck 26 which has an X-Y translating unit 28 associated therewith. The X-Y translating unit is operable to shift the chuck in directions denoted by arrows 29 and 31. Once the wafer is on chuck 26, the chuck can be rotated by movement of a handle 28 in an arc of approximately 90° in either direction of the neutral position shown in FIG. 1. Viewing of the wafer can be seen through the opitcal system 30 of microscope 12. When the wafer has been properly inspected, it is pick-up again by apparatus 10, then the apparatus is shifted to move the wafer to another location where it is separated from apparatus 10 and moved by a conveyor (not shown in FIG. 1) to a second wafer magazine 32. As soon as magazine 32 is filled with wafers 14, the magazine is removed to another work station for further processing of the wafers.

Microscope 12 and its work station 16, magazines 18 and 32, and conveyor means 20 are all conventional in construction. Their use is an advance in the art in so far as they are used in cooperation with apparatus 10 in a manner hereinafter described.

Apparatus 10 includes a pair of concentric rings 34 and 36 which surround the upright post 38 of microscope 12. Post 38 is secured to a base 40 which is adapted to rest on a table top or other suitable surface. Ring 34 is fixed with respect to post 38, while ring 36 is rotatable with respect to and about ring 34 and thereby about post 38.

FIGS. 1 and 4 show a bracket 42 which is L-shaped (FIG. 4) and is secured in any suitable manner to the rear, flat surface 44 of post 38. The horizontal base part 46 of bracket 42 projects laterally and rearwardly from surface 44 and supports an electrical stepper motor 48 having a drive shaft 50 projecting upwardly therefrom. A spur gear 52 is secured by a set screw 54 on shaft 50 and rotates therewith.

A rigid plate 56 is secured to the upper end of bracket 42 and projects laterally therefrom substantially parallel with base part 46. The outer end of plate 56 is secured by one or more screws 58 to the top flat surface 60 of ring 34 with the ring surrounding post 38 and being sufficiently rigid so that ring 34 will rotatably support ring 36. Spur gear 52 is directly below slightly spaced from the bottom flat surface of ring 34 as shown in FIG. 4.

Ring 36 is rotatably mounted on the outer periphery of ring 34 for rotation in opposed directions. However, as used in the present application with microscope 12, ring 36 will rotate only in a clockwise direction relative to ring 34 when viewing FIG. 1. The bearings between rings 34 and 36 can be of any suitable construction but, for purposes of illustration, they are of the type shown in FIG. 3 wherein a bearing 62 is mounted in an annular chamber 64 in ring 34, the ring being formed by a lower body 66 and an upper ringlike cover 68 secured to body 66 by a series of screws 70. A first annular seal 72 is clamped in place beneath cover 68, and the inner peripheral portion 74 of seal 72 slidably engages an annular projection 76 on the inner periphery of ring 36.

A number of bearings 62 are provided to mount ring 36 for rotation on ring 34. Each bearing 62 is above a second annular seal 78 at the bottom of lower body 66 and held in place by an annular bottom plate 80 (by screws not shown). The outer periphery 81 of seal 78 engages a projection 82 on the inner periphery of ring 36 to seal this junction yet the seal allows the two rings to move relative to each other.

The inner periphery of ring 36 at its lower part 84 thereof (FIG. 3) has a ring gear 86 thereon which is in mesh with spur gear 52 as shown in FIG. 4. Thus, when stepper motor 48 is energized, ring gear 36 is rotated relative to ring gear 34.

Outer ring 36 has three wafer pick-up devices 88, 90 and 92. Each of these devices is vacuum operated and is substantially identical to the other devices so that a description of one will suffice for a description of all three.

Each pick-up device includes a rigid member 94 (FIGS. 3 and 4) which has a pair of spaced upright guide pins 95 (FIGS. 1 and 2) and a beveled surface 96 which slopes downwardly as the inner periphery of ring 36 is approached. A conical, flexible suction cup 98 is received within a conical recess 100 in the upper, beveled surface 96, and this suction cup has a center hole 102 which communicates with a hole 104 through member 94 as shown in FIG. 3. Hole 94 is in communication with a passage 105 in a shaft 106 in ring 36. Passage 105 has a lower end which has an annular recess 110 communicating with a hollow space 112 on the inner periphery of ring 36. This hollow space 112 is movable into alignment with and into communication with a duct 114 which places space 112 in fluid communication with chamber 64. A vacuum source is coupled by a fitting 116 to space 64 so that, when space 112 is in alignment with duct 114, a suction force will be applied to passage 108 and thereby to suction cup 98. This suction force is sufficient to draw a wafer into coupled relationship with the suction cup and when this occurs, the wafer will be oriented at an angle as shown in dashed lines in FIG. 3. When so oriented, the wafer can be shifted from a pick-up location adjacent to one end of a conveyor part 24 to work station 16 where chuck 26 can be used to draw the wafer onto the work station for viewing by the optical system 30 of microscope 12.

Shaft 106 is shiftably mounted in ring 36 for up and down movement with respect thereto. A pair of O-ring seals 118 and 119 in coupled relationship between the ring and the shaft are used to assure proper sealing of passage 108 even though shaft 106 can move up and down.

The purpose of the vertical movement shaft 106 is to break the vacuum suction force at suction cup 98. This is accomplished by pulling downward on shaft 106 until recess 110 is aligned with a vent 120 to the atmosphere. When this occurs, recess 110 is out of communication with recess 112 and in fluid communication with vent 120, and a wafer 14 on the suction cup is released.

The suction force is removed from suction cup 98 when the corresponding pick-up device 88, 90 or 92 is at least two locations, namely at a location adjacent to work station 16 and at a location adjacent to magazine 32. At each of these locations, therefore, a shaft pull-down unit 122 is provided (FIG. 5). Unit 122 includes a bracket 124 secured to the lower flat surface 126 of inner ring 34 as shown in FIG. 5. Bracket 124 has a fluid actuated power device 128 secured thereto and provided with a piston rod 130 projecting upwardly and shiftably mounted relative to the bracket. A pull-down member 132 is secured by a set screw 134 to the upper end of piston rod 130. Member 132 has a T-shaped slot 136 which is aligned with the path of travel of a subshaft 138 having a knob 140 on its lower end, shaft 138 being carried by and projecting downwardly from each shaft 106 corresponding to a pick-up device 88, 90 or 92. As shaft 138 and its knob 140 enter the T-shaped slot 136 of a unit 122, such as when ring 36 rotates relative to ring 34, power device 128 is energized and rod 130 is pulled downwardly so that the overlying portions of member 132 engage knob 140 and pull shaft 106 downwardly. This causes recess 110 (FIG. 3) to move out of alignment with recess 112 and into alignment with vent 120. When this occurs, the suction force is removed from suction cup 98 and the wafer 14 carried by the suction cup is released and allowed to settle into a horizontal position either on chuck 26 if the suction cup is at the work station 16 or onto a conveyer means (not shown) associated with magazine 32 if the suction cup is adjacent to such magazine.

Before ring 36 agains moves relative to ring 34 after a shaft 106 has been pulled downwardly, assembly 128 is de-energized, allowing its piston rod 130 to rise under a spring bias force associated with the assembly. This action causes upward movement of shaft 106 to move recess 110 back into alignment with and in fluid communication with recess 112. However, the wafer that was previously on the suction cup will have moved away from the suction cup so that the suction force once again applied to the suction cup will have no any affect on the wafer. Then, ring 36 will move away from the station having unit 122.

In use, with apparatus 10, mounted on microscope 12 in the manner shown in FIG. 1, the main purpose of the apparatus is to convey wafers one by one from magazine 18 to work station 16 for inspection and then to advance the inspected wafers one by one to magazine 32. Thus, each wafer from magazine 18 is fed by conveyer 20 toward and into coupled relationship with a pick-up device such as device 88 as shown in FIG. 1. When the wafer moves under the influence of conveyor 20 to the pick-up device, the wafer eventually engages the upright guide pins 95 on member 94 of the pick-up device. Simultaneously, the wafer will be drawn by suction to the suction cup 98 of the pick-up device since the corresponding shaft 106 will be in the operating position shown in FIG. 3. This suction force will tilt the wafer into the dashed line position shown in FIG. 3, thereby lifting the wafer off the conveyor and placing the wafer in a position so that it can be advanced to work station 16 while being tilted and projecting outwardly from the outer periphery of ring 36.

Motor 48 is then energized by a suitable control (not shown) including a suitable switch which is hand or foot-operated. This causes ring 36 to rotate in a clockwise sense when viewing FIG. 1 so that the wafer held by device 88, for instance, will be advanced and moved into vertical alignment with chuck 26 at work station 16. When full aligned, the shaft 106 (FIG. 3) associated with the suction cup 98 of pick-up device 88 will have its stub shaft 138 and knob 140 in the position shown in FIG. 5 with respect to the pull-down member 132 adjacent to the work station 16. Then, the control will cause actuation of the corresponding power device 128, pulling downwardly on the corresponding shaft 106, breaking the suction at the suction cup 98 and allowing the wafer 14 to be released from pick-up device 88 and to become coupled by vacuum to chuck 26. Then, the chuck can be shifted by the X-Y translating unit 28 so that the paper can be viewed through optical system 30 at various locations on the wafer.

Following the inspection of the wafer, chuck 26 is moved so that it is again at its initial position and as suction is being applied to the suction cup of the pick-up device adjacent to the chuck. As the wafer is moved into overlying relationship with the suction cup 98 of the pick-up device 88, suction is removed from chuck 26 in a conventional manner and the suction at the suction cup pulls the wafer onto the pick-up device 88 and against the adjacent guide pins 93. The wafer then becomes coupled once again to the pick-up device, and stepper motor 48 is again energized to advance the outer ring 36 relative to inner ring 34 through an angle of approximately 120° where the wafer is aligned with a conveyor means (not shown in FIG. 1) associated with magazine 32. At this point the vacuum is removed from the suction cup by the actuation of the corresponding power device 128 (FIG. 5) at this location, and this releases the suction force at the suction cup, causing the wafer to gravitate onto the conveyor means and then to be transported into magazine 32.

When pick-up device 88, for instance, is adjacent to chuck 26, pick-up device 92 will be aligned with conveyor 20 and will be receiving a wafer 14. Also, pick-up device 90 will be at the location aligned with magazine 32 and will have delivered a wafer to the adjacent conveyor means. In this way, apparatus is continuous in operation in picking up wafers, moving the wafers to the inspection station, picking up the wafers after being inspected, moving the wafers to the station aligned with magazine 32, then repeating these steps. This operation continues until all of the wafers in magazine 14 have been moved to the inspection station, inspected, and then moved toward and into magazine 32.

Other wafer holding devices can be used on ring 36, if desired. The devices can be mechanical as well as vacuum operated. For instance, FIGS. 6 and 7 show a wafer holding device broadly denoted by the numeral 200 and operable to support a wafer 14 (shown in dashed lines in FIG. 6) so that the wafer can be moved to the work station 16 or the station aligned with magazine 32 as shown in FIG. 1.

Figure 6:
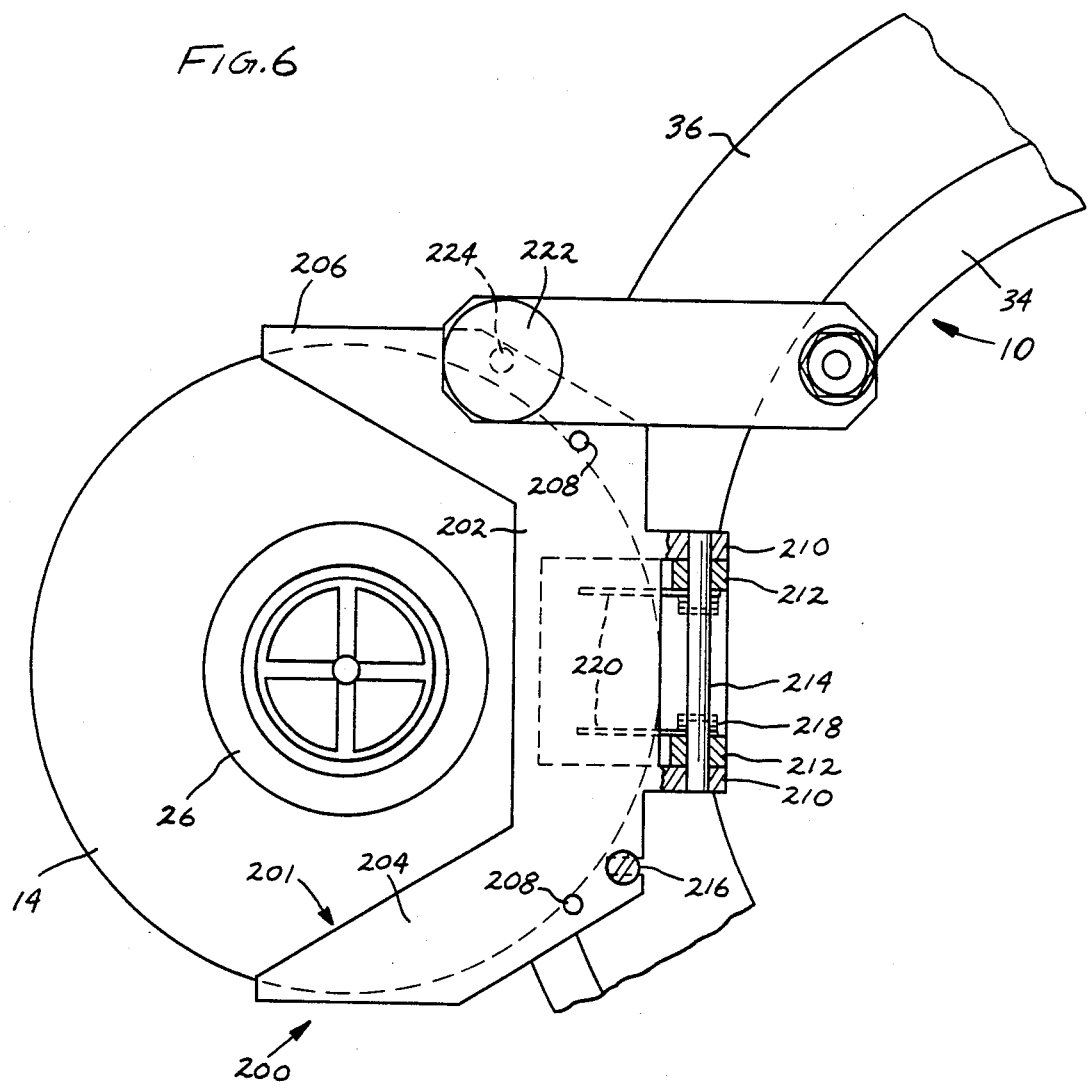
FIG. 6 is an enlarged, top plan view of a portion of the apparatus showing a mechanical pick-up device for carrying a wafer to and from the work station of the microscope.
Figure 7:
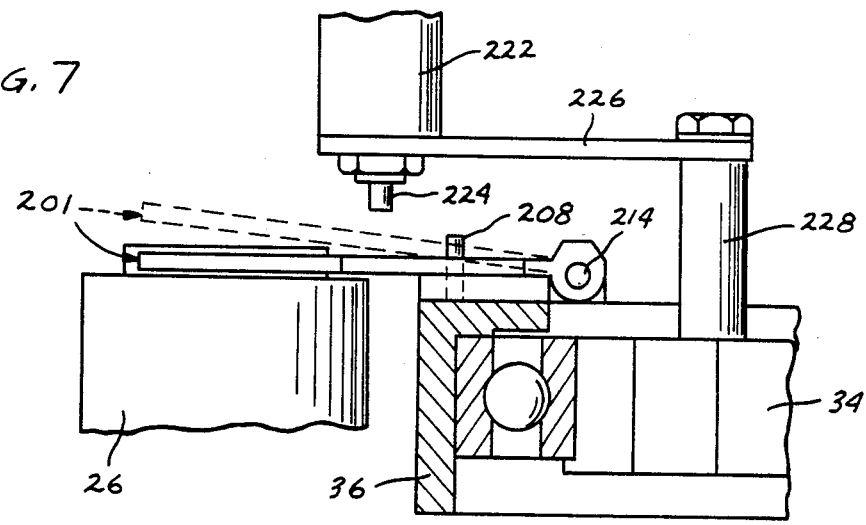
FIG. 7 is a side elevational view, partly in section of the portion of the apparatus shown in FIG. 6.

Pick-up device 200 includes a U-shaped body 201 having a flat upper surface and defined by a central segment 202 and a pair of side segments 204 and 206 extending outwardly from the ends of central segment 202 as shown in FIG. 6. The flat upper surface of body 201 is adapted to support a wafer and the wafer, when it engages a pair of guide pins 208, can be carried in a slightly tilted attitude about microscope 12 from one location to the other.

Central segment 202 has a pair of spaced, parallel ears 210 (FIG. 6) which are adjacent to a pair of rigid projections 212 secured to ring 36 in any suitable manner. A hinge pin 214 couples projections 212 with adjacent ears 210 so that body 201 can pivot upwardly away from ring 36 at least to a limited extent. A screw 216 carried by ring 36 extends through a slot (FIG. 6) in body 201. Screw 216 has a head above body 201 to limit the upper swinging movement of the body about the pivot axis of hinge pin 214. A coil spring 218 about pin 214 has legs 220 (FIG. 6) bearing against central segment 202 to bias the latter upwardly; however, the head of screw 216 limits this upper movement to a position at which the flat upper surface of body 201 is slightly inclined or tilted yet this surface can be moved into a horizontal position shown in FIG. 7 for facilitating the removal of the wafer from vacuum operated. For instance, FIGS. 6 and 7 show a wafer holding device broadly denoted by the numeral 200 and operable to support a wafer 14 (shown in dashed lines in FIG. 6) so that the wafer can be moved to the work station 16 or the station aligned with magazine 32 as shown in FIG. 1.

Pick-up device 200 includes a U-shaped body 201 having a flat upper surface and defined by a central segment 202 and a pair of side segments 204 and 206 extending outwardly from the ends of central segment 202 as shown in FIG. 6. The flat upper surface of body 201 is adapted to support a wafer and the wafer, when it engages a pair of guide pins 208, can be carried in a slightly tilted attitude about microscope 12 from one location to the other.

Central segment 202 has a pair of spaced, parallel ears 210 (FIG. 6) which are adjacent to a pair of rigid projections 212 secured to ring 36 in any suitable manner. A hinge pin 214 couples projections 212 with adjacent ears 210 so that body 201 can pivot upwardly away from ring 36 at least to a limited extent. A screw 216 carried by ring 36 extends through a slot (FIG. 6) in body 201. Screw 216 has a head above body 201 to limit the upper swinging movement of the body about the pivot axis of hinge pin 214. A coil spring 218 about pin 214 has legs 220 (FIG. 6) bearing against central segment 202 to bias the latter upwardly; however, the head of screw 216 limits this upper movement to a position at which the flat upper surface of body 201 is slightly inclined or tilted yet this surface can be moved into a horizontal position shown in FIG. 7 for facilitating the removal of the wafer from device 200.

A fluid power device 222, such as an air cylinder, has a shiftable piston rod 224. Device 222 is carried by a bar 226 secured to a post 228 on inner ring 32 as shown in FIGS. 6 and 7. Rod 224 is positioned so that its lower end will engage the upper surface of leg 206 of body 201 at a location outboard of the outer periphery of wafer 14 when the wafer is on body 201 in the dashed line position shown in FIG. 6. By forcing the body 201 downwardly, piston rod 224 will allow wafer 14 to move onto the chuck 26 shown in FIGS. 6 and 7 (assuming body 201 is adjacent to work station 16) or onto the conveyor means associated with magazine 32 (assuming that body 201 is adjacent to such conveyor means). A suitable control (not shown) will operate assembly 222 at the proper time.

In operation, after device 200 (FIG. 6) has been moved into position adjacent chuck 26, power device 220 is energized to cause piston rod 224 to move downwardly to force body 201 into its horizontal position shown in FIG. 7 from a slightly inclined position. This will lower the wafer on body 201 so that the wafer will be coupled by suction to the chuck and inspection of the wafer can be made during this inspection. The chuck can be moved about with reference to the optical system 30 of microscope 12 and, after inspection has been completed, the wafer is again moved by the chuck into the position shown in FIG. 6. Then the power device 222 is de-energized, allowing body 201 to tilt slightly upwardly. Ring 36 will then be rotated relative to ring 34 and the wafer will be moved by body 201 to the next work station, the station aligned with magazine 32 (FIG. 1).

Figure 8:
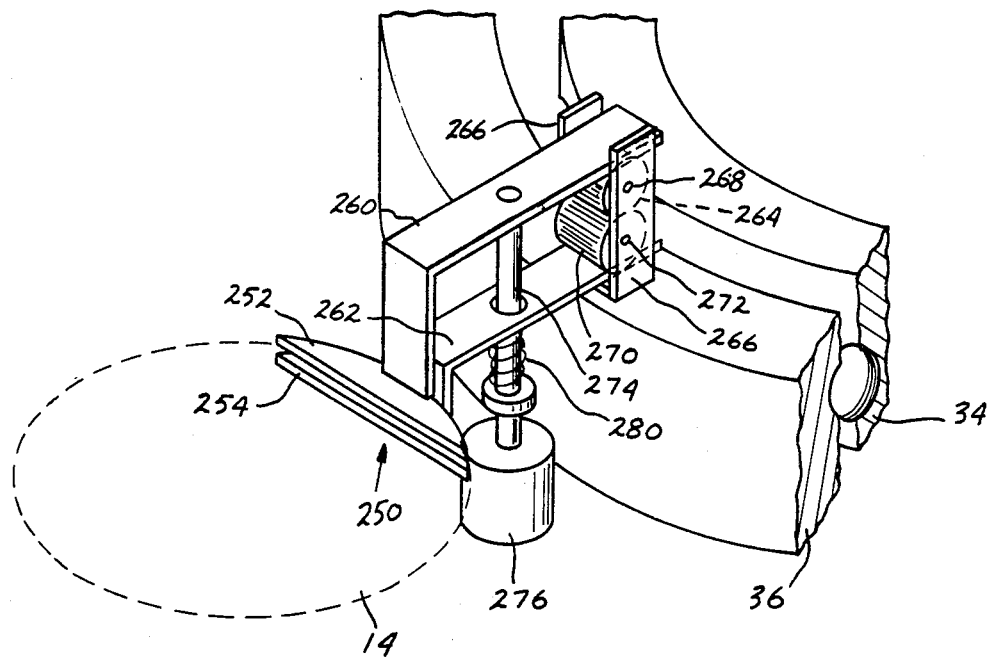
FIG. 8 is a perspective view of still another view embodiment of the apparatus of the present invention showing another type of mechanical pick-up device for carrying a wafer to and from the work station of the microscope.
Figure 9:
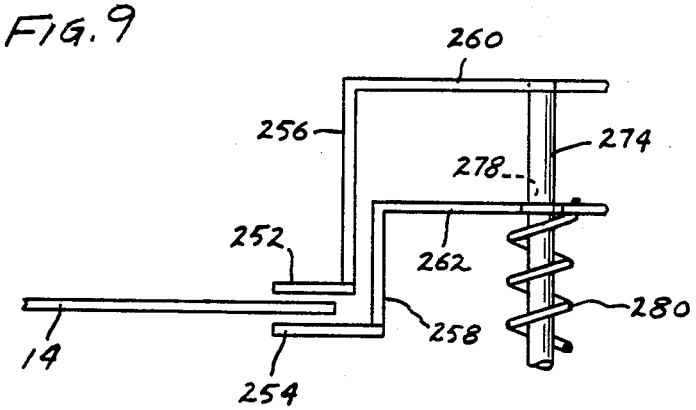
FIG. 9 is a fragmentary, side elevational view of the jaws of the pick-up device of FIG. 8.

Still another type of mechanical pick-up device is shown in FIGS. 8 and 9 and broadly denoted by the numeral 250. Device 250 includes a pair of jaws 252 and 254 which are coupled with upright members 256 and 258 respectively, members 256 and 258 having generally horizontal arms 260 and 262 which are pivotly coupled to the flat upper surface of outer ring 36. The upper arm 260 has a first gear 264 secured to the lower face thereof, this gear being rotatably mounted on a pair of upright posts 266 by a pivot pin 268. Posts 266 are secured to ring 36. The inner end of lower arm 262 has a second gear 270 secured to its upper surface, gears 264 and 270 being in mesh with each other. Gear 270 is pivotly mounted by a pin 272 on post 266.

A shaft 274 is coupled to a fluid power device 276 secured to the outer periphery of ring 36. Shaft 274 has an upper end which is secured to the lower surface of arms 260 but shaft 274 is freely movable through an opening 278 in the lower arm 262.

A spring 280 surrounding shaft 274 bias's arm 262 in a downward direction when viewing FIGS. 8 and 9 and, since gears 264 and 270 are in mesh with each other, this bias force bias's arm 260 upwardly. Thus, jaws 252 and 254 are normally open.

When it is desired to couple a wafer 14 to pick-up device 250, the wafer is moved, such as by conveyor means 20 into the space between jaws 252 and 254 as shown in FIG. 9. Then, power device 276 is energized to pull arm 260 downwardly which, in turn, causes arm 262 to move upwardly because of the coupling between gears 264 and 270. This closes the jaws and causes the jaws to clamp onto the adjacent outer peripheral portion of the wafer, and the wafer is releasably coupled to the jaws. Then, outer ring 36 is advanced to the next location in which the jaws carry the wafer to such location, such as to chuck 26. By de-energizing assembly 276, the jaws will open, slightly lowering the wafer and leaving the wafer free to be moved, such as by chuck 26. Return of the wafer into the gap between the jaw and then energizing power device 276 will cause the jaws to clamp once again onto the wafer to allow the wafer to be carried to the next station.

The present invention provides an article handling apparatus of simple and rugged construction, one in which a wafer or other article can be positively coupled to a hold-down device for movement from one work station to another along a continuous path of travel. The apparatus is compace in size and shape so that it can be used with substantially all types of conventional microscopes without interfering with their normal operation.

What is claimed is:

1. In combination: a microscope having an upright post and a work station; a pair of concentric rings; means mounting one of the rings in a fixed position on said post in surrounding relationship thereto; means mounting the other ring on said one ring for rotation relative thereto with the other ring surrounding said one ring; means coupled with the other ring for rotating the same relative to said one ring; and a number of circumferentially spaced wafer pick-up devices secured to the other ring for movement therewith, each device adapted to receive a semiconductor wafer and to releasably couple the wafer to the other ring whereby, when the other ring moves relative to said one ring, the wafer can be transported from a first location along the outer periphery of the other ring to said work station and released and thereafter the wafer can be picked up from said work station and transported to a second location along said outer periphery and released again.

2. Apparatus as set forth in claim 1, wherein is included means coupled with said one ring for mounting the rings in a generally horizontal plane.

3. Apparatus as set forth in claim 1, wherein said rotating means comprises a motor having means coupling the same to the other ring.

4. Apparatus as set forth in claim 3, wherein said other ring has a ring gear on its inner periphery, said motor having a drive shaft, said coupling means including a spur gear connecting the drive shaft of the stepper motor with said ring gear.

5. Apparatus as set forth in claim 1, wherein each of said pick-up devices is vacuum-actuated.

6. Apparatus as set forth in claim 5, wherein each pick-up device has a flexible suction cup, said rings having means for coupling the suction cup to a source of vacuum.

7. Apparatus as set forth in claim 6, wherein each pick-up device has a surface surrounding the corresponding suction cup, said surface being beveled.

8. Apparatus as set forth in claim 7, wherein said surface slopes downwardly and is the inner periphery of the other ring is approached.

9. Apparatus as set forth in claim 6, wherein said other ring has a fluid passage therein communicating with said suction cup, said one ring having a recess therein adapted to be coupled with the source of vacuum, said fluid passage being moveable into fluid communication with said recess when the corresponding pick-up device is adjacent to said work station.

10. Apparatus as set forth in claim 9, wherein each pick-up device has a shaft, the corresponding fluid passage of said device being in the shaft, said shaft being mounted for movement relative to said other ring, there being a vent in said other ring, and means for shifting the shaft to align the fluid passage with the vent.

11. Apparatus as set forth in claim 10, wherein said shifting means comprises a power device moveable into couple relationship with the shaft as the other ring moves a wafer to a location adjacent to said work station.

12. Apparatus as set forth in claim 1, wherein each device comprises a body pivotally mounted on said other ring and having an upper surface for supporting a semiconductor wafer, means biasing the body into an inclined position, and means coupled with the body for moving the body into generally horizontal position to permit removal of the wafer therefrom.

13. Apparatus as set forth in claim 12, wherein said body includes a central, rigid segment and a pair of said segments, said segments having flat upper surfaces, said moving means including a power actuated device engageable with the body for forcing the same in the opposite direction.

14. Apparatus as set forth in claim 1, wherein each device comprises a pair of jaws mounted on said other member and moveable relative to each other to clamp a semiconductor wafer therebetween, and means coupled with jaws for moving the same relative to each other.

15. Apparatus as set forth in claim 14, wherein each jaw has a rigid member thereon, said members being pivotally mounted on said other ring for rotation relative thereto about perspective, generally parallel axes, said power device being coupled to one of said members.

16. Apparatus as set forth in claim 15, wherein each of said members has a gear rigidly secured thereto, the gears of the members being in mesh with each other, said other ring having an upright post thereon, the gears being rotatably mounted on said post, whereby when the power device is actuated, the jaws are moveable toward and away from each other.

* * * * *